United States Patent
Tantot

(10) Patent No.: US 10,102,312 B2
(45) Date of Patent: Oct. 16, 2018

(54) METHOD OF DETERMINING THE PERFORMANCE OF AT LEAST ONE PROPELLER OF A TURBOMACHINE IN AN AIR STREAM UNDER GYRATION

(75) Inventor: Nicolas Jerome Jean Tantot, Paris (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 1123 days.

(21) Appl. No.: 14/239,355

(22) PCT Filed: Aug. 14, 2012

(86) PCT No.: PCT/FR2012/051903
§ 371 (c)(1),
(2), (4) Date: Feb. 18, 2014

(87) PCT Pub. No.: WO2013/024231
PCT Pub. Date: Feb. 21, 2013

(65) Prior Publication Data
US 2014/0180657 A1    Jun. 26, 2014

(30) Foreign Application Priority Data
Aug. 17, 2011 (FR) ...................... 11 57373

(51) Int. Cl.
G06F 7/60 (2006.01)
G06F 17/50 (2006.01)
(52) U.S. Cl.
CPC ................ G06F 17/5009 (2013.01)
(58) Field of Classification Search
CPC .................................. G06F 17/5009
(Continued)

(56) References Cited

U.S. PATENT DOCUMENTS 3,680,317 A * 8/1972 Kotoc ............... F01K 25/00
417/159
4,563,129 A * 1/1986 Pagluica ............. B64C 11/48
416/129

(Continued)

FOREIGN PATENT DOCUMENTS

GB    2 220 712    1/1990

OTHER PUBLICATIONS

A.H. Techet ("Hydrodynamics for Ocean Engineers", Massachusetts Institute of Technology, pp. 1-20, 2004).*

(Continued)

*Primary Examiner* — Omar Fernandez Rivas
*Assistant Examiner* — Iftekhar Khan
(74) *Attorney, Agent, or Firm* — Oblon, McClelland, Maier & Neustadt, L.L.P.

(57) ABSTRACT

A method for determining performance levels of at least one turbine engine propeller in an incident air flow (V) including an axial component ($V_z$) and a tangential component ($V_\Theta$), the propeller being modelled by a defined generalized theoretical model ($M_g$), for plural blade angles (ß) of the propeller, by a set of adimensional coefficients, including at least one generalized advance coefficient ($J_g$), a generalized power coefficient ($CP_g$), and a generalized traction coefficient ($CT_g$) defined by formulae:

$$\begin{cases} J_g = \dfrac{v_z}{u - v_\theta} \\ C_{Tg}(\beta) = \dfrac{T(\beta)}{\rho \cdot (u - v_\theta)^2 \cdot D^2} \\ C_{Pg}(\beta) = \dfrac{P(\beta)}{\rho \cdot (u - v_\theta)^3 \cdot D^2} \end{cases}$$

(Continued)

wherein the generalized theoretical model ($M_g$) of the propeller is parameterized with input conditions of the turbine engine, including at least the axial component (Vz), the tangential component of the incident air flow ($V_\Theta$), the blade angle (ß) and the drive speed (u) of the propeller; and at least the traction performance level (T) and power performance level (P) of the propeller are derived from the parameterized generalized theoretical model ($M_g$).

12 Claims, 2 Drawing Sheets

(58) Field of Classification Search
USPC ................................................ 703/2
See application file for complete search history.

(56) References Cited

U.S. PATENT DOCUMENTS

| | | | | |
|---|---|---|---|---|
| 4,817,382 A * | 4/1989 | Rudolph | ................ | F02C 3/067 416/129 |
| 4,969,800 A * | 11/1990 | Parry | ................ | B64C 11/18 416/238 |
| 5,079,916 A * | 1/1992 | Johnson | ................ | B64C 11/48 416/129 |
| 6,591,873 B1 * | 7/2003 | McNeil | ................ | F01D 5/022 141/105 |
| 8,464,511 B1 * | 6/2013 | Ribarov | ................ | B64C 11/48 60/226.1 |
| 9,017,028 B2 * | 4/2015 | Fabre | ................ | B64C 11/48 416/128 |
| 9,085,372 B2 * | 7/2015 | Saucray | ................ | B64D 31/12 |
| 2005/0175458 A1 * | 8/2005 | Romero Vazquez | .... | B63H 1/14 416/204 R |
| 2008/0179455 A1 * | 7/2008 | Gallet | ................ | B64C 11/306 244/65 |
| 2010/0054913 A1 * | 3/2010 | Morel | ................ | B64C 11/18 415/68 |
| 2010/0206982 A1 * | 8/2010 | Moore | ................ | B64C 11/48 244/62 |
| 2010/0251692 A1 * | 10/2010 | Kinde, Sr. | ................ | F02K 5/026 60/226.1 |
| 2010/0297896 A1 * | 11/2010 | Duncan | ................ | B63H 23/321 440/52 |
| 2011/0076143 A1 * | 3/2011 | Gallet | ................ | F01D 7/00 416/1 |
| 2011/0243735 A1 * | 10/2011 | Balk | ................ | B64C 11/48 416/129 |
| 2011/0311361 A1 * | 12/2011 | Charier | ................ | F02C 3/067 416/129 |
| 2012/0288358 A1 * | 11/2012 | Balk | ................ | B64C 11/48 415/124.1 |
| 2012/0328433 A1 * | 12/2012 | Quiroz-Hernandez | ................ | B64C 11/008 416/1 |
| 2013/0000313 A1 * | 1/2013 | Udall | ................ | F16L 39/04 60/772 |
| 2013/0011259 A1 * | 1/2013 | Balk | ................ | B64C 11/306 416/128 |
| 2014/0017086 A1 * | 1/2014 | Charier | ................ | B64C 11/308 416/128 |

OTHER PUBLICATIONS

Dimitrios Laskos ("Design and Cavitation Performance of Contra-Rotating Propellers", Massachusetts Institute of Technology, pp-1-142, 2010).*
Koronowicz et al. ("A complete design of contra-rotating propellers using the new computer system", Polish Maritime Research 1(64) 2010 vol. 17; pp. 14-24).*
Robert E. Davidson("Optimization and Performance Calculation of Dual_Rotation Propellers", Nasa Technical Report, pp. 1-45, 1981).*
Martin Hepperle ("Aerodynamic Characteristics of Propellers", pp. 1-2, 2003).*
Chen et al. ("A Design Method and an Application for Contrarotating Propeiiers",DTRC-90/003 1990, oo 1-25).*
International Search Report dated Dec. 5, 2012, in PCT/FR12/051903 filed Aug. 14, 2012.
"Dimensionless Parameters for Turbomachinery", Chapter 7, Basic Concepts in Turbomachinery, XP-002687521, Jan. 1, 2009, pp. 83-93.

* cited by examiner

METHOD OF DETERMINING THE PERFORMANCE OF AT LEAST ONE PROPELLER OF A TURBOMACHINE IN AN AIR STREAM UNDER GYRATION

The present invention relates to a method for determining the performance levels of at least one propeller of a turbine engine, and more specifically, determining the performance levels of a pair of contra-rotating propellers for propelling an aircraft.

When a new type of turbine engine is being developed, it is known to determine the performance levels of the turbine engine in a theoretical manner using a numerical thermodynamic model which represents the turbine engine. Owing to the thermodynamic model, it is possible to determine the fundamental values (pressures, temperatures, fluid flow rates) which control the operation of the turbine engine by means of a processor and to derive therefrom the forces applied thereto for specific operational conditions (altitude, travel speed of the aeroplane, control information of the turbine engine, etcetera). The implementation of this model in the context of a turbine engine comprising a propeller also involves determining the traction and power performance levels of the propeller. The use of the thermodynamic model is indispensable for predicting the performance level of the turbine engine in its entire range of operation, and supplies the design and optimisation of all the components which it comprises. The advance knowledge of the thermodynamic model of the turbine engine allows the use of partial tests of components to be limited and allows the optimisation of the design of the components to be directed in a relevant manner, further contributing to the reduction of the cost and the development cycle of a turbine engine.

With reference to FIG. 1, there is known in the prior art a method for determining the performance levels of a single turbine engine propeller in which the turbine engine propeller is conventionally modelled by means of a theoretical model M which is in the form of a table comprising a set of adimensional coefficients, including an advance coefficient J, a power coefficient CP and a traction coefficient CT defined for a plurality of blade angles of the propeller ß, for a plurality of axial incident air flow speeds $V_z$ and for a plurality of peripheral propeller rotational speeds u. Owing to this theoretical model M, it is possible to determine the performance levels of the propeller in real time and to obtain, at the output S of the model M, the traction T and the power P of the propeller for a specific blade angle ß, a specific peripheral propeller rotational speed u and a specific axial incident air flow speed $V_z$.

In order to limit the fuel consumption and to limit the $CO_2$ emissions, turbine engines comprising a pair of contra-rotating propellers have been proposed. The very low level of compression of each propeller minimises the losses via kinetic energy, which ensures a propellant yield which is close to the maximum theoretical value. Furthermore, the distribution of the overall compression over two successive propellers enables a significant reduction of the diameter thereof in comparison with a simple conventional propeller, thus substantially limiting the constraints of dimensional integration of the turbine engine on the aircraft.

During the operation of the propellers of the pair, the first upstream propeller receives a flow of axial air and redirects it tangentially. The second downstream propeller thus receives an incident air flow which comprises a gyration. Since the air flow received by the second propeller is not axial, the second propeller cannot be modelled by means of a theoretical model in accordance with the prior art.

The property of contra-rotation of the second propeller with respect to the first enables compensation for the residual gyration at the output of the first propeller, thus ensuring an almost axial flow at the output of the pair of propellers, which improves the yield of the compression of the turbine engine. The operation of these two propellers is generally based on the principle of conventional propellers, each propeller being provided with an individual pitch change mechanism, which allows separate control of the rotational speed of each propeller.

The overall modelling of a pair of contra-rotating propellers is known for some predetermined operating conditions, using complex aerodynamic methods. In addition to these points, it is not possible to model in a rapid and precise manner the operation of the pair of propellers. In particular, it is not possible, using the known modelling, to determine the performance levels of a pair of contra-rotating propellers for a first specific blade angle of the first propeller and for a second specific blade angle of the second propeller. In practice, the modelling of the pair of propellers for specific operating conditions requires several hours of calculation which prevents any determination in real time.

One of the objects of the present invention is to determine in real time the performance levels of a turbine engine comprising a pair of propellers for varied operating conditions, in particular for any combination of flow conditions of an incident air flow, blade angle of the blades of the propellers and peripheral propeller rotational speed.

More generally, the invention is intended to determine the performance levels of at least one turbine engine propeller for various combinations of input parameters, in particular for an incident air flow which comprises a tangential component.

To this end, the invention relates to a method for determining the performance levels of at least one turbine engine propeller in an incident air flow comprising an axial component and a tangential component, the propeller being modelled by means of a defined generalised theoretical model, for a plurality of blade angles of the propeller, by a set of adimensional coefficients, including at least one generalised advance coefficient $J_g$, a generalised power coefficient $CP_g$ and a generalised traction coefficient $CT_g$ defined by the following formulae:

$$\begin{cases} J_g = \dfrac{v_z}{u - v_\theta} \\ C_{Tg}(\beta) = \dfrac{T(\beta)}{\rho \cdot (u - v_\theta)^2 \cdot D^2} \\ C_{Pg}(\beta) = \dfrac{P(\beta)}{\rho \cdot (u - v_\theta)^3 \cdot D^2} \end{cases}$$

in which formulae:
u corresponds to the drive speed of the propeller;
$V_z$ corresponds to the axial component of the speed of the incident air flow;
$V_\theta$ corresponds to the tangential component of the incident air flow, counted positively in the direction of the drive speed u;
ρ corresponds to the density of the air;
D corresponds to the diameter of the propeller;
T corresponds to the traction of the propeller;
P corresponds to the power of the propeller;
β corresponds to the blade angle of the propeller;
in which method:

the generalised theoretical model of the propeller is parameterised with input conditions of the turbine engine, including at least the axial component and the tangential component of the incident air flow, the blade angle and the drive speed of the propeller; and at least the traction performance level and power performance level of the propeller are derived from the parameterised generalised theoretical model.

Owing to the method according to the invention, it is possible to determine the performance levels of a propeller for all conditions of incident air flow, in particular for an incident air flow which comprises a tangential component. The individual performance levels of a downstream propeller of a pair of propellers may be determined in a manner independent of the upstream propeller of the pair, which is advantageous. Furthermore, the determination is rapid and may be implemented in real time given that only the model of the propeller is modified. Advantageously, the complexity of the algorithms for determining performance levels is not affected.

Preferably, the method is implemented by a physical processor which is on the ground (computer, processing server, etcetera) or on board the turbine engine.

Preferably, a processor for controlling the turbine engine, for example, of the FADEC ("Full Authority Digital Engine Control") type allows optimum prediction of the blade angle required in order to comply with predetermined rotation information of the propellers. Owing to this implementation on such an on board processor, the turbine engine reacts in a precise and reactive manner to the information received, for example, by the pilot of the aircraft on which the turbine engine is mounted.

The invention further relates to a method for determining the performance levels of a turbine engine comprising a first upstream propeller and a second downstream propeller which form a pair of contra-rotating propellers, the first and the second propellers being modelled by means of a first generalised theoretical model and a second generalised theoretical model, as defined above, respectively, in which method:

the generalised theoretical models are parameterised with input conditions of the turbine engine, including at least the axial component $V_1(z)$ of the incident air flow $V_1$ of the first propeller, the drive speed $u_1$ of the first propeller and the drive speed $u_2$ of the second propeller, the blade angles β1 of the first propeller and β2 of the second propeller;

at least the traction performance level $T_1$ and power performance level $P_1$ of the first propeller are derived from the first parameterised generalised theoretical model;

the tangential component $V_2(\theta)$ and axial component $V_2(z)$ of the incident air flow $V_2$ received by the second propeller are calculated in accordance with the traction performance level $T_1$ and power performance level $P_1$ of the first propeller; and at least the traction performance level $T_2$ and power performance level $P_2$ of the second propeller are derived from the second generalised theoretical model in accordance with the input conditions and tangential component $V_2(\theta)$ and axial component $V_2(z)$ of the incident air flow received by the second propeller.

Owing to the method according to the invention, it is possible to determine the performance levels of a pair of propellers by measuring the individual performance levels of the propellers. Furthermore, the determination is rapid and can be implemented in real time given that only the model of the propeller is modified. Advantageously, the complexity of the algorithms for determining performance levels of a turbine engine is not affected.

Preferably, the tangential component of the incident air flow received by the second propeller is obtained by the following formula:

$$V_2(\theta) = \frac{P_1}{\frac{\rho \cdot S \cdot u_1}{2}\left[\sqrt{\frac{2 \cdot T_1}{\rho \cdot S} + V_1(z)^2} + V_1(z)\right]}$$

and the axial component of the incident air flow received by the second propeller is obtained by the following formula:

$$V_2(z) = \sqrt{\frac{2 \cdot T_1}{\rho \cdot S} + V_1(z)^2}$$

in which formulae S corresponds to the surface of the action disc of the first propeller.

Owing to the above formulae, there are obtained by means of analytical calculation all the parameters required to determine the performance levels of the pair of propellers which saves time and allows the performance levels of the pair of propellers to be determined in real time.

The invention will be better understood upon reading the following description, given purely by way of example, and with reference to the appended drawings, in which.

It should be noted that the Figures set out the invention in a detailed manner for implementing the invention, the Figures of course being able to serve to better define the invention where applicable.

Determination of the Performance Levels of a Single Propeller

According to the prior art, as set out above, a propeller is modelled by means of a defined theoretical model M, for a plurality of blade angles β, by means of a set of adimensional coefficients, including at least one advance coefficient J, a power coefficient CP and a traction coefficient CT. This model M is valid only for a purely axial incident flow $V_z$ and does not allow a propeller to be modelled in an incident flow V comprising an axial component $V_z$ and a tangential component $V_\theta$.

According to the invention, the propeller is modelled with a defined generalised theoretical model Mg, for a plurality of blade angles ß, by means of a set of adimensional coefficients including at least one generalised advance coefficient Jg, a generalised power coefficient CPg and a generalised traction coefficient CTg. This generalised model Mg is valid both for a purely axial incident flow $V_z$ and for an incident flow V comprising an axial component $V_z$ and a tangential component $V_\theta$. Indeed, a purely axial flow $V_z$ is an incident flow V whose tangential component $V_\theta$ is zero.

The modelling is carried out by a physical processor, preferably a computer or a processing server which is on the ground or on board.

Figure 1:
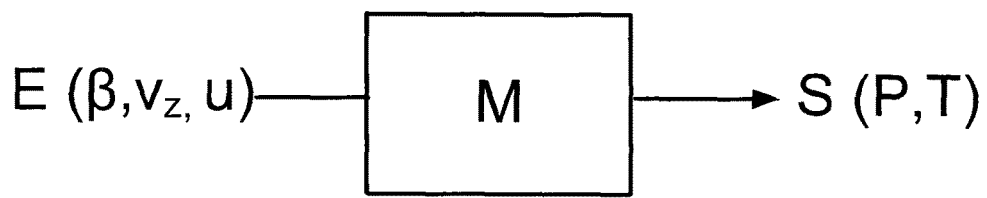
FIG. 1 is a schematic illustration of the determination of the performance levels of a propeller of a turbine engine according to the prior art (already set out)
Figure 2:
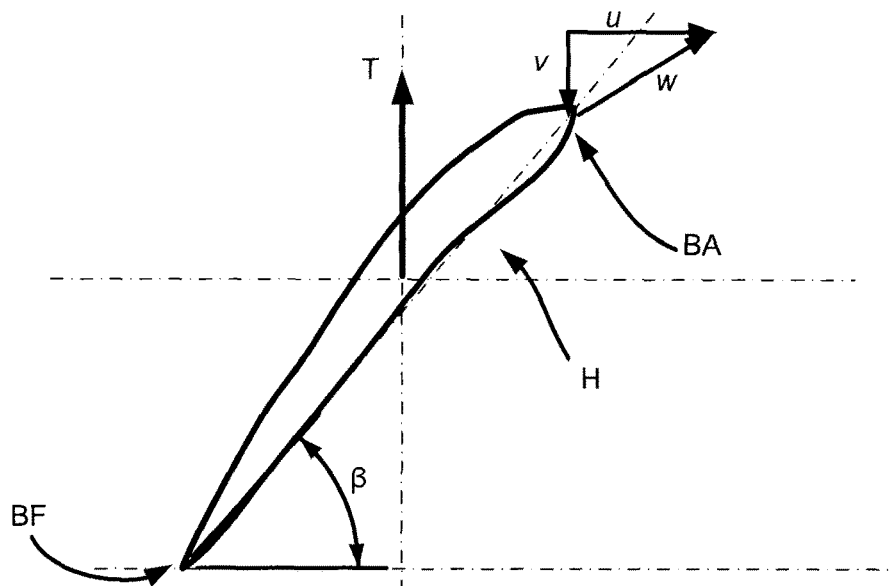
FIG. 2 is a cross-section of a blade of a propeller in an axial incident flow.
Figure 3:
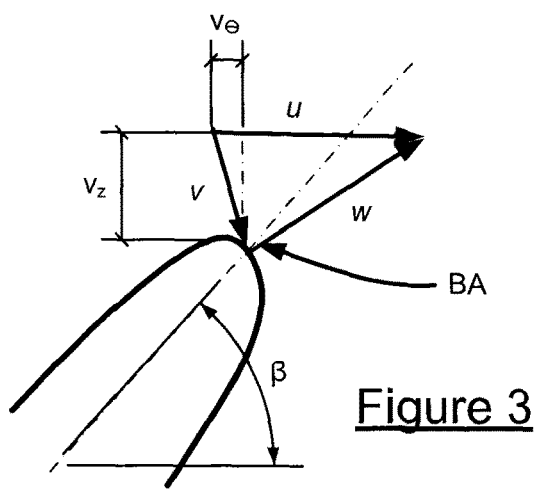
FIG. 3 is a close-up view of the leading edge of the blade in an incident flow comprising an axial component and a tangential component.

The formulae for obtaining the generalised coefficients Jg, CPg and CTg will be set out with reference to FIGS. 2 and 3.

Theoretical Model for Axial Incident Flow

With reference to FIG. 2, there is first considered a propeller H, having a diameter D, comprising a plurality of blades which each have a leading edge BA and a trailing edge BF, the blade angle ß of the blade of the propeller H being defined between the rotation plane and the mean chord of the profile.

Firstly, it is assumed that the propeller H is driven by a purely axial incident air flow having a speed $V_z$. Subsequently, the volume density of the air is designated ρ. In a conventional manner, the peripheral speed vector u of the propeller H is defined by the following formula: u=N·D, the parameter N corresponding to the rotational speed of the propeller.

In a known manner, the adimensional coefficients of a propeller field in an axial incident flow are defined by the following formulae for a specific rotational speed u:

$$C_T(\beta) = \frac{T(\beta)}{\rho \cdot N^2 \cdot D^4} = \frac{T(\beta)}{\rho \cdot u^2 \cdot D^2} \quad (1)$$

$$C_P(\beta) = \frac{P(\beta)}{\rho \cdot N^3 \cdot D^5} = \frac{P(\beta)}{\rho \cdot u^3 \cdot D^2} \quad (2)$$

$$J = \frac{v_z}{N \cdot D} = \frac{v_z}{u} \quad (3)$$

In these formulae, the parameter T corresponds to the traction of the propeller H whilst the parameter P corresponds to the power of the propeller H. The adimensional coefficients CT and CP defined in this manner are functions of the blade angle ß. In this manner, owing to the theoretical model M of the propeller H, the power P and the traction T are known for a specific rotational speed u and a specific blade angle ß in accordance with the axial speed $V_z$ of the incident flow.

General Theoretical Model for Axial and Tangential Incident Flow

A supply of the propeller H by an incident air flow whose speed V comprises an axial component $V_z$ and a tangential component $V_\theta$ such that $\vec{v}=\vec{v}_z+\vec{v}_\theta$ as illustrated in FIG. 3 will now be considered. Subsequently, the tangential component $V_\theta$ is counted positively in the direction of the rotational speed u of the propeller H.

With reference to FIG. 3, by applying the triangle of the speeds, the norm w of the relative speed seen by the blade profile is obtained:

$$w^2=(\vec{v}-\vec{u})^2=v^2+u^2-2\cdot\vec{u}\cdot\vec{v}=v_z^2+(u-v_\theta)^2$$

By comparison with the definition of the adimensional coefficients J, CP and CT defined for a purely axial supply, it is derived that:

u−$v_\theta$ performs the function of u previously in the formulae 1 to 3;

$v_z$ performs the function of $v_z$ previously in the formula 1.

By analogy with the theoretical model M according to the prior art, a generalised theoretical model Mg is derived whose generalised coefficients Jg, CPg and CTg are defined as follows:

$$C_{Tg}(\beta) = \frac{T(\beta)}{\rho \cdot (u - v_\theta)^2 \cdot D^2} \quad (5)$$

$$C_{Pg}(\beta) = \frac{P(\beta)}{\rho \cdot (u - v_\theta)^3 \cdot D^2} \quad (6)$$

$$Jg = \frac{v_z}{u - v_\theta} \quad (7)$$

Preferably, the components u, $v_z$ and $v_\theta$ are defined for a mean height of the blade of the propeller.

Figure 4:
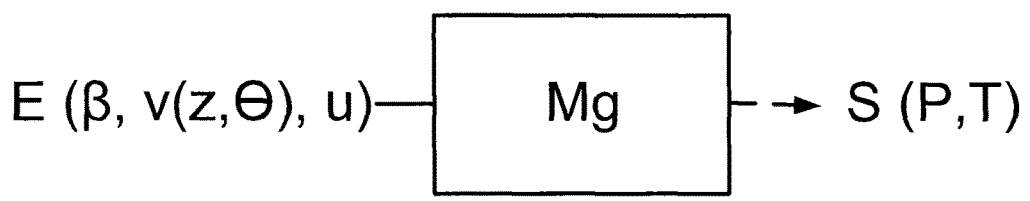
FIG. 4 is a schematic illustration of the determination of the performance levels of a propeller of a turbine engine according to the invention in an incident flow comprising an axial component and a tangential component.

The generalised coefficients Jg, CTg, CPg obtained previously allow a generalised theoretical model Mg to be formed whose form is similar to a model according to the prior art in order to be used in a method for determining the performance levels of a turbine engine in real time. Owing to such a generalised model, it is possible to determine the performance levels of a propeller for any type of incident flow and, in particular, an incident flow comprising a tangential component. With reference to FIG. 4, the propeller is modelled by means of a theoretical model Mg whose generalised coefficients Jg, CTg, CPg are defined by a plurality of blade angles ß for a plurality of peripheral propeller rotational speeds u and for any incident speed V($V_z$, $V_\theta$). This is particularly advantageous for determining the performance levels of a pair of propellers as set out in detail below.

Determining the Performance Levels of a Pair of Propellers

The method for determining the performance levels of a turbine engine comprising a first upstream propeller H1 and a second downstream propeller H2 forming a pair of contra-rotating propellers will be set out in detail below with reference to FIGS. 5 and 6. First of all, each propeller H1, H2 of the pair is modelled by means of a generalised theoretical model Mg as set out above.

In a conventional manner, the first upstream propeller H1 receives an axial incident flow $V_1(z)$, and redirects it by gyration. The second downstream propeller H2 then receives an incident flow comprising an axial and tangential component $V_2(z, \theta)$ owing to the gyration of the first upstream propeller H1 (FIG. 6).

Figure 5:
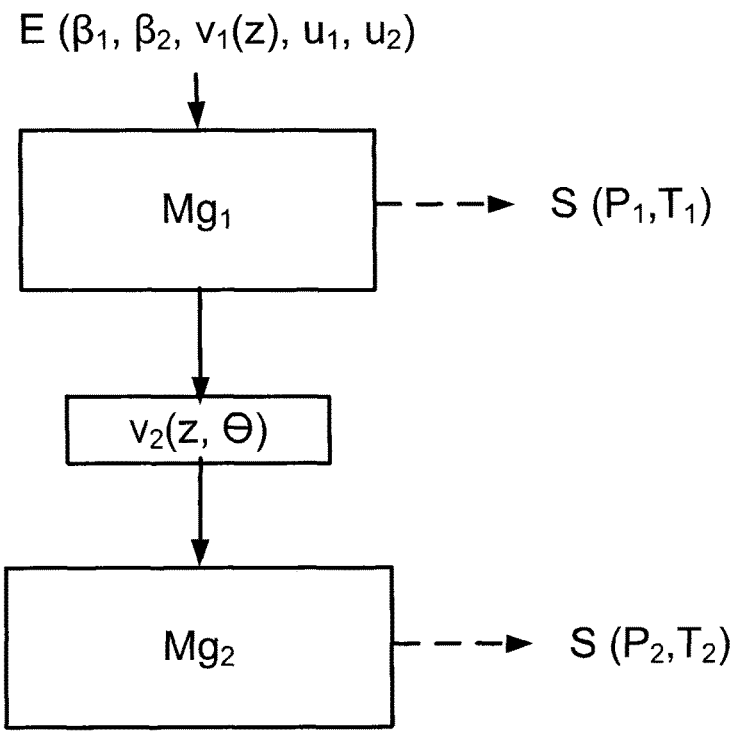
FIG. 5 is a schematic illustration of the determination of the performance levels of a pair of contra-rotating propellers.
Figure 6:
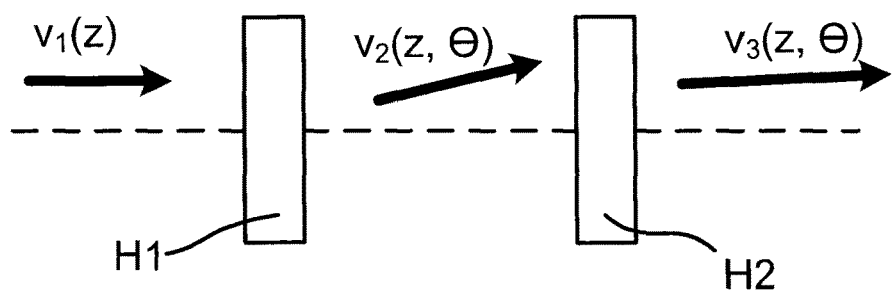
FIG. 6 schematically illustrates the circulation of an air flow between two propellers of a pair of propellers.

With reference to FIG. 5, the first upstream propeller H1 is modelled by means of a first generalised theoretical model Mg, whilst the second downstream propeller H2 is modelled by means of a second generalised theoretical model $Mg_2$. The propellers H1, H2 receive incident flows $V_1$, $V_2$ for blade angles $ß_1$, $ß_2$ respectively.

The determination of the performance levels of the first propeller H1 is conventional and allows the power $P_1$ and the traction $T_1$ of the first propeller H1 to be determined at the output S, using the first generalised model $Mg_1$ for an axial air flow $V_1(z)$.

In order to determine the power $P_2$ and the traction $T_2$ of the second propeller H2 using the second generalised model $Mg_2$, it is necessary to know the axial component $V_2(z)$ and tangential component $V_2(\theta)$ (or $v_\theta$) of the incident air flow received by the second propeller H2, after travelling the distance which separates the second propeller H2 from the first propeller H1. The tangential component $V_2(\theta)$ of the incident air flow received by the second propeller H2 can be obtained by applying the Euler theorem (fundamental relationship of rotating machines) to the first upstream propeller H1. In this theorem, $\Delta H$ corresponds to the enthalpy variation through the propeller H1.

$$\Delta H = \Delta(\vec{u} \cdot \vec{v}_z) = (\vec{u} \cdot \vec{v}_z)_{output} - \underbrace{(\vec{u} \cdot \vec{v}_z)_{input}}_{=0(axial\ supply)} = u \cdot V_2(\theta) \quad (8)$$

$$V_2(\theta) = \frac{\Delta H}{u} \quad (9)$$

The knowledge of the enthalpy variation $\Delta H$ through the first propeller H1 allows the tangential component $v_\theta$ of the flow at the output to be derived. By applying the first principle of thermodynamics to the transformation applied to the flow when passing through the first propeller H1, assumed to be adiabatic, the enthalpy variation $\Delta H$ can be linked with the power $P_1$ developed by the transformation and to the mass flow rate W processed during the transformation:

$$P_1 = W \cdot \Delta H \quad (10)$$

$$V_2(\theta) = \frac{P_1}{W \cdot u_1} \quad (11)$$

The power $P_1$ can be determined on the basis of the adimensional coefficients of the first generalised theoretical model $Mg_1$ of the first propeller H1 which receives an axial air flow $V_1(z)$. In order to estimate the mass flow rate processed by the first propeller H1, the simplified Froude theory is applied, which is generally considered for the 2D modelling of the flows of propellers. This theory, which is based on the hypothesis of an incompressible flow and on the representation of the propeller as a pressure discontinuity surface, allows the variation of the speed through the propeller and consequently the mass flow rate W processed to be expressed.

The calculation of the flow rate resulting from the application of this theory is as follows:

$$W = \rho \cdot S \cdot Vt \quad (12)$$

In this formula, the parameter Vt represents the speed through the first propeller H1 and the parameter S represents the surface area of the action disc of the propeller, akin to Pi $D^2/4$.

In accordance with the Froude theory, this speed Vt is equal to half of the general increase of speed which leads from the input speed $V_1$, to the output speed $V_2$ of the first propeller H1 so that:

$$Vt = \frac{V_2(z) + V_1(z)}{2} \quad (13)$$

$$V_2(z) = \sqrt{\frac{2 \cdot T_1}{\rho \cdot S} + V_1(z)^2}. \quad (14)$$

The mass flow rate W processed is thus obtained as follows:

$$W = \rho \cdot S \cdot \left(\frac{V_2(z) + V_1(z)}{2}\right) = \frac{\rho \cdot S}{2}\left[\sqrt{\frac{2 \cdot T_1}{\rho \cdot S} + V_1(z)^2} + V_1(z)\right] \quad (15)$$

For the first propeller, the input speed $V_1$ is equal to $V_1(z)$. The value of the tangential component $v_\theta$ desired is equal to $$V_2(\theta) = \frac{P_1}{\frac{\rho \cdot S \cdot u_1}{2}\left[\sqrt{\frac{2 \cdot T_1}{\rho \cdot S} + V_1(z)^2} + V_1(z)\right]} \quad (16)$$

In this manner, the tangential component $V_2(\theta)$ received by the second propeller H2 can be determined in an analytical manner which allows the performance levels of the second propeller H2 to be determined in a direct manner and in real time using the second generalised model $Mg_2$ as illustrated in FIG. 5.

Since all the input conditions are known, the power $P_2$ and the traction $T_2$ provided by the second propeller H2 of the pair are derived therefrom. The overall power and traction performance levels for the pair of propellers H1, H2 are determined. This determination can advantageously be carried out in real time, which has advantages in terms of duration and cost of a development cycle for a pair of propellers.

There has been set out above an implementation of the method according to the invention within a processor on the ground for the design of a turbine engine but it is self-evident that the processor could also be located on board.

Advantageously, a processor for controlling the turbine engine, for example, of the FADEC type, allows the above-mentioned method to be implemented in order to predict the blade angle required to comply with predetermined information for rotating the propellers. In this manner, if a pilot of the aircraft on which the turbine engine is mounted sends propeller speed information to the turbine engine, the control processor allows the optimum blade angles to be defined so that the turbine engine reacts to the information in a precise and reactive manner, which is advantageous.

In practice, the generalised theoretical models are defined in the control processor in order to ensure control of the blade angles of the propellers. The reaction time is improved given that the blade angles are defined in a predictive manner using theoretical models which are implanted in the control processor.

In this manner, the control processor of the turbine engine allows the two propellers to be controlled comprehensively and simultaneously, which differs from the prior art in which the propellers were controlled independently.

The invention claimed is:

1. A method for controlling performance levels of at least one downstream turbine engine propeller in an incident air flow (V) in gyration including an axial component ($V_z$) and a tangential component ($V_\theta$), the downstream propeller being modelled by a defined generalized theoretical model ($M_g$), for a plurality of blade angles ($\beta$) of the downstream propeller, by means of a set of adimensional coefficients, including at least one generalized advance coefficient ($J_g$), a generalized power coefficient ($CP_g$) and a generalized traction coefficient ($CT_g$) defined by the following formulae:

$$\begin{cases} J_g = \dfrac{v_z}{u - v_\theta} \\ C_{Tg}(\beta) = \dfrac{T(\beta)}{\rho \cdot (u - v_\theta)^2 \cdot D^2} \\ C_{Pg}(\beta) = \dfrac{P(\beta)}{\rho \cdot (u - v_\theta)^3 \cdot D^2} \end{cases}$$

in which formulae:
u corresponds to the drive speed of the propeller,
$V_z$ corresponds to the axial component of the speed of the incident air flow,
$V_\theta$ corresponds to the tangential component of the incident air flow, counted positively in the direction of the drive speed u,
$\rho$ corresponds to the density of the air,
D corresponds to the diameter of the propeller,
T corresponds to the traction of the propeller,
P corresponds to the power of the propeller,
$\beta$ corresponds to the blade angle of the propeller, the method comprising:
parameterizing, with processing circuitry, the generalized theoretical model of the downstream propeller with input conditions of the turbine engine, including at least the axial component ($V_z$) and the tangential component ($V_\theta$) of the speed of incident air flow, that is produced by the upstream propeller, the blade angle ($\beta$) and the drive speed (u) of the propeller and
deriving, with the processing circuitry, at least the traction performance level (T) and performance level of the power (P) of the downstream propeller from the parameterized generalized theoretical model; and
controlling, with the processing circuitry, at least one of the upstream and downstream propellers based on at least the performance level of the traction (T) and the performance level of the power (P) of the downstream propeller that are derived.

2. A controlling method according to claim 1, wherein the method is implemented by the processing circuitry that is a physical processor on the round.

3. A controlling method according to claim 1, wherein the method is implemented by the processing circuitry that is a physical processor on board the turbine engine.

4. A controlling method according to claim 1, wherein the method is implemented by the processing circuitry that is a control processor of fill authority digital engine control (FADEC) type.

5. A method for controlling performance levels of a turbine engine including a first upstream propeller and a second downstream propeller which form a pair of contra-rotating propellers, the first and the second propellers being modelled by a first generalized theoretical model and a second generalized theoretical model respectively, the models being defined according to claim 1, the method comprising:
parameterizing, with the processing circuitry, the first and second generalized theoretical models with input conditions of the turbine engine, including at least an axial component ($V_1(z)$) of an incident air flow of the first propeller, a drive speed ($u_1$) of the first propeller and a drive speed ($u_2$) of the second propeller, blade angles ($\beta_1$) of the first propeller and ($\beta_2$) of the second propeller;
deriving, with the processing circuitry, at least a performance level of a traction ($T_1$) and a performance level of a power ($P_1$) of the first propeller from the first parameterized generalized theoretical model;
calculating, with the processing circuitry, a tangential component ($V_2(\Theta)$) and an axial component ($V_2z$)) of an incident air flow received by the second propeller in accordance with the performance level of the traction (T1) and the performance level of the power ($P_1$) of the first propeller; and
deriving, with the processing circuitry, at least a performance level of a traction ($T_2$) and a performance level of a power (P2) of the second propeller from the second parameterized generalized theoretical model in accordance with the input conditions and the tangential component ($V_2(\Theta)$) and the axial component ($V_2(z)$) of the incident air flow received by the second propeller.

6. A controlling method according to claim 5, wherein the tangential component ($V_2(\Theta)$) of the incident air flow received by the second propeller is obtained by the following formula:

$$V_2(\theta) = \dfrac{P_1}{\dfrac{\rho \cdot S \cdot u_1}{2}\left[\sqrt{\dfrac{2 \cdot T_1}{\rho \cdot S} + V_1(z)^2} + V_1(z)\right]}$$

and the axial component ($V_2(z)$) of the incident air flow received by the second propeller is obtained by the following formula:

$$V_2(z) = \sqrt{\dfrac{2 \cdot T_1}{\rho \cdot S} + V_1(z)^2}$$

in which formulae S corresponds to a surface area of an action disc of the first propeller.

7. A controlling method according to claim 5, wherein the method is implemented by the processing circuitry that is a physical processor on the ground.

8. A controlling method according to claim 5, wherein the method is implemented by the processing circuitry that is a physical processor on board the turbine engine.

9. A controlling method according to claim 7, wherein the method is implemented by the processing circuitry that is a control processor of fill authority digital engine control (FADEC) type.

10. A controlling method according to claim 1, wherein the deriving, with the processing circuitry, at least a performance level of the traction (T) and a performance level of the power (P) of the downstream propeller from the parameterized generalized theoretical model is performed in real time.

11. A controlling method according to claim 1, further comprising controlling, with the processing circuitry the upstream and downstream propellers simultaneously based on at least the performance level of the traction (T) and the performance level of the power (P) of the downstream propeller that are derived.

12. A controlling method according to claim 1, further comprising controlling, with the processing circuitry blade angles of at least one of the upstream and downstream propellers based on at least the performance level of the traction (T) and the performance level of the power (P) of the downstream propeller that are derived.

* * * * *

UNITED STATES PATENT AND TRADEMARK OFFICE
CERTIFICATE OF CORRECTION

PATENT NO. : 10,102,312 B2
APPLICATION NO. : 14/239355
DATED : October 16, 2018
INVENTOR(S) : Nicolas Jerome Jean Tantot Page 1 of 2

It is certified that error appears in the above-identified patent and that said Letters Patent is hereby corrected as shown below:

On the Title Page

Column 2, (56) Other Publications, Line 12, change "Propeiiers" to --Propellers--;

In the Claims

Column 8, Line 65, change "propeller in an" to --propeller which is positioned behind an upstream propeller having a same axis which produces for the downstream propeller an--;

Column 8, Line 66, change "flow (V) in gyration" to --flow in gyration--;

Column 8, Line 66, change "component ($V_z$) and" to --component and--;

Column 8, Line 67, change "component ($V_e$), the" to --component, the--;

Column 9, Lines 1-2, change "model ($M_g$), for" to --model, for--;

Column 9, Line 2, change "angles (β) of" to --angles of--;

Column 9, Line 3, change "by means of a set" to --by a set--;

Column 9, Line 18, change "the drive speed" to --a drive speed--;

Column 9, Line 18, change "the propeller," to --a downstream propeller;--;

Column 9, Line 19, change "the axial component of the speed" to --an axial component of speed--;

Column 9, Line 20, change "flow," to --flow;--;

Column 9, Line 21, change "the tangential" to --a tangential--;

Signed and Sealed this
Fifteenth Day of October, 2019

Andrei Iancu
*Director of the United States Patent and Trademark Office*

Column 9, Line 22, change "incident air" to --speed of the incident air--;

Column 9, Line 22, change "in the direction" to --in a direction--;

Column 9, Line 23, change "drive speed u," to --drive speed u;--;

Column 9, Line 24, change "the density of the air," to --a density of air;--;

Column 9, Line 25, change "the diameter of the propeller," to --a diameter of the downstream propeller;--;

Column 9, Line 26, change "the traction of the propeller," to --a traction of the downstream propeller;--;

Column 9, Line 27, change "the power of the propeller," to --a power of the downstream propeller;--;

Column 9, Line 28, change "the blade angle of the propeller," to --a blade angle of the downstream propeller;--;

Column 9, Line 34, change "of incident air flow," to --speed of the incident air flow--;

Column 9, Line 35, change "angle (β) and" to --angle (β), and--;

Column 9, Line 36, change "propeller and" to --downstream propeller;--;

Column 9, Lines 37-38, change "the traction performance level" to --a performance level of the traction--;

Column 9, Line 38, change "and performance" to --and a performance--;

Column 9, Line 48, change "on the round" to --on the ground--;

Column 9, Line 54, change "of fill authority" to --of full authority--;

Column 10, Line 10, change "component ($V_2z$)) of" to --component ($V_2(z)$) of--;

Column 10, Line 13, change "(T1) and" to --($T_1$) and--;

Column 10, Line 17, change "power (P2)" to --power ($P_2$)--;

Column 10, Line 52, change "fill authority" to --full authority--;

Column 10, Line 61, change "circuitry the" to --circuitry, the--; and

Column 10, Line 67, change "circuitry blade" to --circuitry, blade--.